United States Patent [19]
Kitamura

[11] Patent Number: 5,491,714
[45] Date of Patent: Feb. 13, 1996

[54] WAVELENGTH-VARIABLE SEMICONDUCTOR LASER LIGHT SOURCE

[75] Inventor: Atsushi Kitamura, Tokyo, Japan

[73] Assignee: Ando Electric Co., Ltd., Tokyo, Japan

[21] Appl. No.: 389,039

[22] Filed: Feb. 15, 1995

[30] Foreign Application Priority Data

Feb. 28, 1994 [JP] Japan .................................. 6-054580

[51] Int. Cl.⁶ ................................................. H01S 3/08
[52] U.S. Cl. ............................... 372/92; 372/32; 372/38; 372/102
[58] Field of Search ............................... 372/92, 102, 38, 372/32, 98, 99, 109

[56] References Cited

U.S. PATENT DOCUMENTS 5,394,418 2/1995 Shiozawa .................................. 372/32

Primary Examiner—Leon Scott, Jr.
Attorney, Agent, or Firm—Finnegan, Henderson, Farabow, Garrett & Dunner

[57] ABSTRACT

The purpose of the present invention is to provide a wavelength-variable semiconductor laser light source in which the oscillation wavelength of the semiconductor laser can be set up at higher resolution under phase-continuous conditions. In the present invention, semiconductor laser 1 outputs outgoing light from the end face with an antireflection film. The output light is split into transmitted light and reflected light by a beam splitter which is fixed on a parallel sliding stage. The transmitted light is incident on a diffraction grating fixed on a moving stage which is provided on the parallel sliding stage. The parallel sliding stage moves in parallel with the optical axis of semiconductor laser. A PSD is provided for inputting the expanded light and outputting an electric signal which is proportional to an amount of the displacement of the expanded light. A wavelength setting part arbitrarily sets the oscillation wavelength of the semiconductor laser, and a comparator compares a set signal From the wavelength setting part with the electric signal from the PSD and feeds the result back to the parallel sliding driver which drives the parallel sliding stage.

3 Claims, 3 Drawing Sheets

WAVELENGTH-VARIABLE SEMICONDUCTOR LASER LIGHT SOURCE

BACKGROUND OF THE INVENTION

1. Field of the Invention

The present Invention relates to a wavelength-variable semiconductor laser light source for optical coherent communication, which varies the oscillation wavelength of the semiconductor laser while continuing the phase of oscillated light.

2. Background Art

FIG. 5 is a block diagram showing a conventional wavelength-variable semiconductor laser light source. In FIG. 5, reference numeral 1 indicates a semiconductor laser, reference numeral 1A indicates an antireflection film, reference numerals 2A and 2B indicate lenses, reference numeral 5 indicates a diffraction grating, reference numeral 6 indicates a rotating stage, reference numeral 7 indicates a parallel sliding stage, reference numeral 8 indicates an arm, reference numeral 9 indicates a fixed plate, reference numeral 11 indicates a wavelength setting part, reference numeral 12 indicates a comparator, reference numeral 13 indicates a parallel sliding driver, and reference numeral 16 indicates a displacement gauge.

In the arrangement of FIG. 5, one end face of semiconductor laser 1 is coated with antireflection film 1A. From the end face with the antireflection film, outgoing light 3B is outputted. The outgoing light 3B is transformed into collimated light by lens 2B and is incident on the central part of diffraction grating 5. At this time, the central part of the diffraction grating 5 and the other end face without an antireflection film of the semiconductor laser 1 form an external resonator. Semiconductor laser 1 oscillates at a single mode and outputs outgoing light 3A from the other end Face.

Here, diffraction grating 5 is fixed on rotating stage 6 and the rotating stage 6 is provided on parallel sliding stage 7 which moves in parallel with the optical axis of semiconductor laser 1. Furthermore, the rotating stage 6 is in contact with fixed plate 9 via arm 8. Therefore, arm 8 slides on the plane of fixed plate 9, whereby the parallel motion of parallel sliding stage 7 is transformed into the rotational motion of rotating stage 6; thus, the oscillation wavelength of semiconductor 1 is varied under phase-continuous conditions by way of the parallel movement of the parallel sliding stage 7.

Wavelength setting part 11 sets up the oscillation wavelength of semiconductor 1. Displacement gauge 17 detects the amount of the parallel displacement of parallel sliding stage 7 and outputs a displacement signal which corresponds to the amount of the parallel displacement. Comparator 10 compares a set signal from wavelength setting part 9 and the displacement signal from displacement gauge 16 and outputs a control signal to parallel sliding driver 13 in accordance with the result of the comparison. In this way, the oscillation wavelength of semiconductor laser 1 is set arbitrarily within the resolution of the displacement gauge under phase-continuous conditions.

On the other hand, outgoing light 3A from the other end face without an antireflection film of semiconductor laser 1 is transformed into collimated light via lens 2A; and the collimated light becomes an output light from the wavelength-variable semiconductor laser light source.

The set resolution of the oscillation wavelength of the semiconductor laser 1 is limited by the resolution of the rotation angle of the diffraction grating which acts as an external mirror of the semiconductor laser; thus, in order to raise the set resolution of the oscillation wavelength, it is necessary to raise the resolution of the rotation angle of the diffraction grating.

However, in the arrangement of FIG. 5, the rotation angle of the diffraction grating 5 is calculated in accordance with the amount of the parallel displacement of the parallel sliding stage 7; thus, the set resolution of the oscillation wavelength of the semiconductor laser is limited by the resolution of the displacement gauge 16 which detects the amount of the parallel displacement of the parallel sliding stage.

The relationship between quantity ΔX of the parallel displacement of parallel sliding stage 7 and oscillation wavelength λ of the semiconductor laser 1 is represented by the following formula, in which d is the interval of the grooves of the diffraction grating, θ is the initial angle of tile diffraction grating, Δθ is the angle of the rotation of the diffraction grating, L is the initial length of the external resonator, and m is the order of the oscillation mode.

$$\lambda = 2 \cdot d \cdot \sin(\theta + \Delta\theta) = 2(L + \Delta X)/m$$

FIG. 4 shows an example result of the calculation in accordance with the above formula, in which interval d of the grooves of the diffraction grating is 1/1200 mm, initial angle θ is 68.4°, initial length L of the external resonator is 36.27 mm, order m of the oscillation mode is 46800. According to FIG. 4, a displacement gauge which can detect the amount of the parallel displacement of the parallel sliding stage 7 with the resolution of 10 nm or less is needed in order to make the set resolution of the oscillation wavelength of semiconductor laser 1 to be 0.4 pm (picometer).

However, the resolution of the presently-obtainable displacement gauge regarded as one having the highest resolution, which gauge is of a strain gauge-type or a differential transformer-type, is 20 nm at best. Therefore, a problem occurs in that the oscillation wavelength of the semiconductor laser 1 cannot be set up with a resolution of 0.8 pm or less, the value (0.8 pm) corresponding to the resolution (20 nm) of the displacement gauge 16.

On the other hand, the displacement gauge based on an interference method by using, for example, a Michelson interferometer can have a resolution of 20 nm or less. However, in this case, the system for constructing the gauge is complicated; thus, it is not practical to use this type of gauge for the wavelength-variable semiconductor laser light source in which the oscillation wavelength of the semiconductor laser is set with high resolution under phase-continuous conditions.

SUMMARY OF THE INVENTION

Therefore, the purpose of the present invention is to provide a wavelength-variable semiconductor laser light source in which the oscillation wavelength of the semiconductor laser can be set up at higher resolution under phase-continuous conditions.

Therefore, the present invention provides a wavelength-variable semiconductor laser light source comprising: a semiconductor laser whose one end face is coated with an antireflection film; a parallel sliding stage which moves in parallel with the optical axis of the semiconductor laser by a parallel sliding driver; a beam splitter fixed on the parallel sliding stage, for splitting outgoing light from the end face coated with the antireflection film into transmitted light and reflected light; a diffraction grating fixed on a rotating stage which is provided on the parallel sliding stage, the diffraction grating for inputting the transmitted light from the beam splitter so as to form an external resonator with the other end face of the semiconductor laser; a transformation mechanism for transforming the parallel motion of the parallel sliding stage into the rotational motion of the rotating stage; a lens for expanding the reflected light From the beam splitter; a PSD for inputting the expanded light from the lens and outputting an electric signal which is proportional to an amount of the displacement of the expanded light the displacement being caused by the parallel movement of the parallel sliding stage; a wavelength setting part for arbitrarily setting the oscillation wavelength of the semiconductor laser; and a comparator for comparing a set signal from the wavelength setting part with the electric signal from the PSD and feeding the result of the comparison back to the parallel sliding driver.

The wavelength-variable semiconductor light source described above may further comprise a total reflection mirror for reflecting diffracted light from the diffraction grating so as to return the light to the semiconductor laser.

In addition, the wavelength-variable semiconductor light source may provide a light source, fixed on the parallel sliding stage, for outputting light to the PSD. In this case, the beam splitter is not provided.

In the case of providing the beam splitter, outgoing light from the end face coated with an antireflection film of the semiconductor laser is split into transmitted light and reflected light by the beam splitter which is fixed on the parallel sliding stage, and the reflected light from the beam splitter is expanded by the lens to be incident on the PSD. On the other hand, in the case of providing the light source, outgoing light from the light source is expanded by the lens to be incident on the PSD. In the both cases, the oscillation wavelength of semiconductor laser 1 is set arbitrarily with high resolution under phase-continuous conditions by utilizing the detection characteristics with high resolution of the PSD.

DESCRIPTION OF PREFERRED EMBODIMENTS

Figure 1:
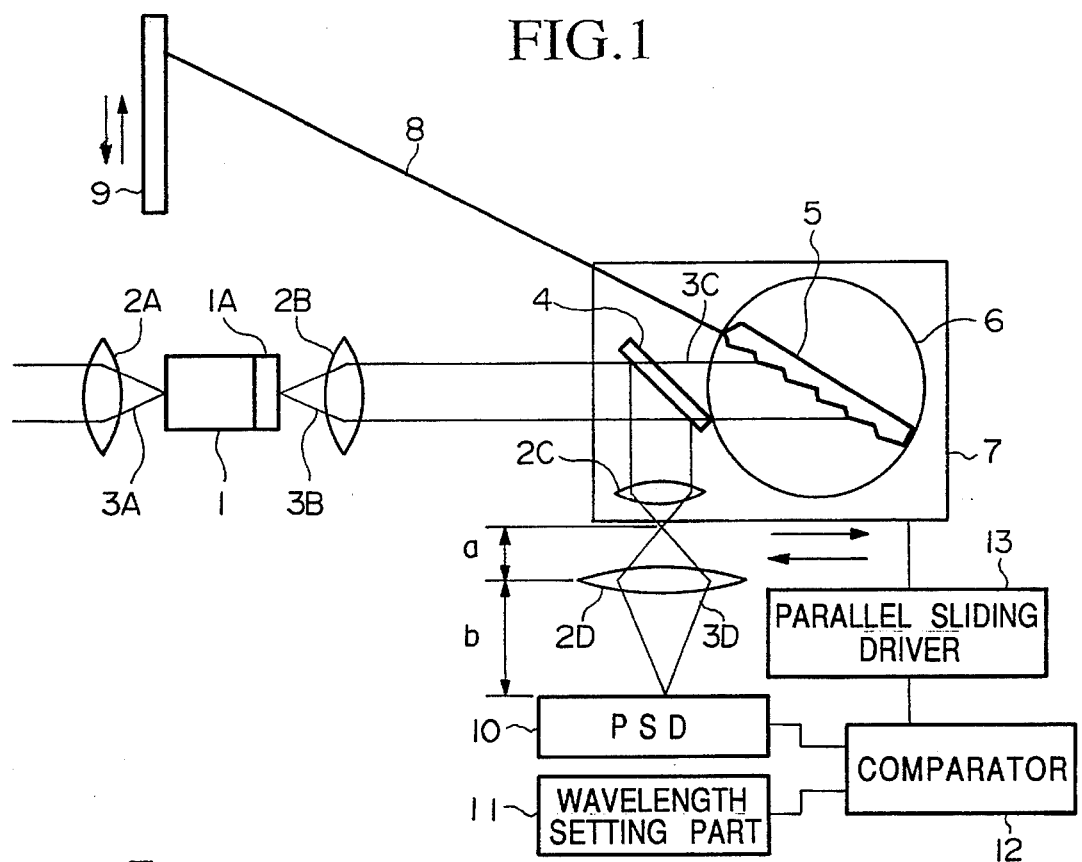
FIG. 1 is a block diagram showing the wavelength-variable semiconductor laser light source according to an embodiment of the present invention.

FIG. 1 is a block diagram showing the wavelength-variable semiconductor laser light source according to an embodiment of the present invention.

Figure 5:
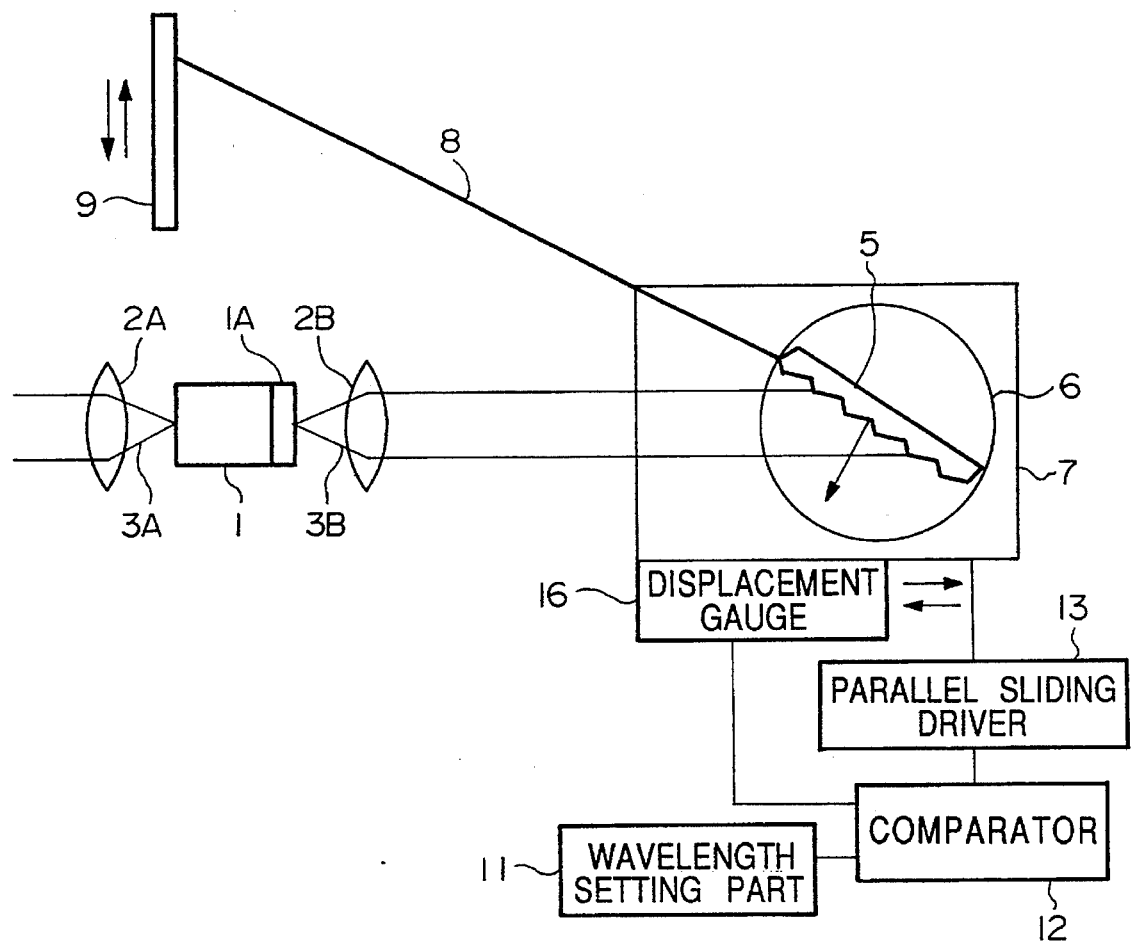
FIG. 5 is a block diagram showing a conventional wavelength-variable semiconductor laser light source.

In FIG. 1, reference numerals 2C and 2D indicate lenses, reference numeral 4 indicates a beam splitter which is fixed on parallel sliding stage 7, and reference numeral 10 indicates a PSD, i.e., position sensitive device, for example, B4243 type with long light-receptive plane, which is available from Hamamatsu Photonics, Inc. Other parts in FIG. 1 are the same as those shown in FIG. 5.

In FIG. 1, semiconductor laser 1 outputs outgoing light 3B from the end face with antireflection film 1A. The output light 3B is transformed into collimated light by lens 2B and is split into transmitted light 3C and reflected light 3D by beam splitter 4. The transmitted light 3C from the beam splitter 4 is input to the central part of diffraction grating 3. At this time, an external resonator is formed by the central part of the diffraction grating 5 and the other end face without an antireflection film of semiconductor laser 1; thus, the semiconductor laser 1 oscillates at a single mode and emits outgoing light 3A from the other end face without an antireflection film.

Diffraction grating 5 is fixed on the rotating stage 6 and the rotating stage 6 is provided on parallel sliding stage 7 which moves in parallel with the optical axis of semiconductor laser 1. Furthermore, the rotating stage 6 is in contact with fixed plate 9 via arm 8. The arm 8 slides on the plane of fixed plate 9, whereby the parallel motion of parallel sliding stage 7 is transformed to the rotational motion of rotating stage 6; thus, the oscillation wavelength of semiconductor 1 is varied under phase-continuous conditions by way of the parallel movement of the parallel sliding stage 7.

On the other hand, reflected light 3D from the beam splitter 4 is transmitted through lenses 2C and 2D to be incident on PSD 10. At this time, the reflected light 3D which forms an image on PSD 10 moves on the PSD by an amount which is proportional to the amount of parallel movement of parallel sliding stage 7; thus, PSD 10 outputs an electric signal which is proportional to the amount of the parallel displacement of the parallel sliding stage 7. Here, the relationship between quantity $\Delta X$ of the parallel displacement of parallel sliding stage 7 and quantity $\Delta y$ of the displacement of the reflected light 3D on the PSD is represented by formula $\lceil \Delta y = m \cdot \Delta X \rfloor$, in which m is the longitudinal magnification (=b/a; see FIG. 1) of lens 2D.

According to the above formula, it is possible to enlarge the quantity $\Delta X$ of the parallel displacement of parallel sliding stage 7 by setting a large value as the longitudinal magnification m. Therefore, by enlarging the longitudinal magnification m within a range in which the diameter of the beam spot of the reflected light 3D which forms an image on PSD 10 does not protrude from the effective area for light reception of PSD 10, the quantity $\Delta X$ of the parallel displacement of parallel sliding stage 7 can be detected with higher resolution. In addition, lens 2D may be substituted to a lens assembly constituted of 2 or more lenses.

Wavelength setting part 11 sets up the oscillation wavelength of semiconductor 1. Comparator 12 compares a set signal from wavelength setting part 11 and the electric signal from PSD 10 and outputs a control signal to parallel sliding driver 13 in accordance with the result of the comparison. In this way, the oscillation wavelength of semiconductor laser 1 is set arbitrarily with high resolution under phase-continuous conditions.

On the other hand, outgoing light 3A from the other end face without an antireflection film of semiconductor laser 1 is transformed into collimated light via lens 2A; and the collimated light becomes an output light from the wavelength-variable semiconductor laser light source.

Hereinbelow, a practical example of the operation of the wavelength-variable semiconductor laser light source in FIG. 1 will be explained.

Figure 4:
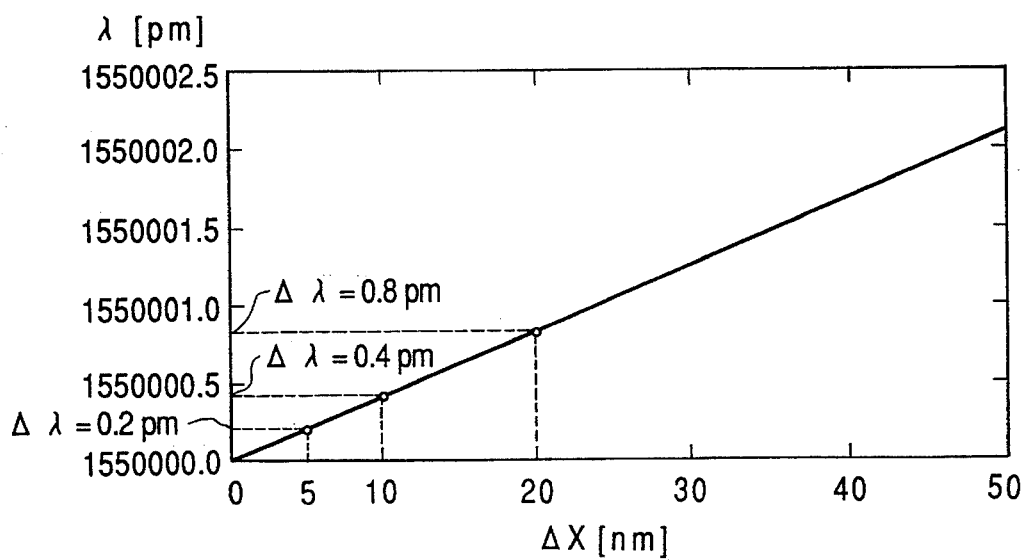
FIG. 4 is a chart explaining the relationship between quantity $\Delta X$ of the parallel displacement and oscillation wavelength $\lambda$ of the semiconductor laser.

In a case in which the diameter φ of the effective area for light reception of PSD 10 is 3 mm, the minimum resolution of the PSD is 0.2 μm, the emission range of semiconductor laser 1 is 3 μm, and lenses 2B and 2C are of the same type, if the longitudinal magnification m of lens 2D is set as "20", the resolution of the parallel displacement of parallel sliding stage 7 is 10 nm. In this case, the set resolution of the wavelength-variable semiconductor laser source of 0.4 pm can be obtained, as shown in FIG. 4.

In addition, if the longitudinal magnification m of lens 2D is set as "40", the resolution of the parallel displacement of parallel sliding stage 7 becomes 5 nm. In this case, the set resolution of the wavelength-variable semiconductor laser source of 0.2 pm can be obtained, as shown in FIG. 4.

According to the emission range of semiconductor laser 1 of 3 μm and the diameter φ of the effective area for light reception of PSD 10 of 3 mm, it is possible to enlarge the longitudinal magnification m up to "1000" at the most.

Figure 2:
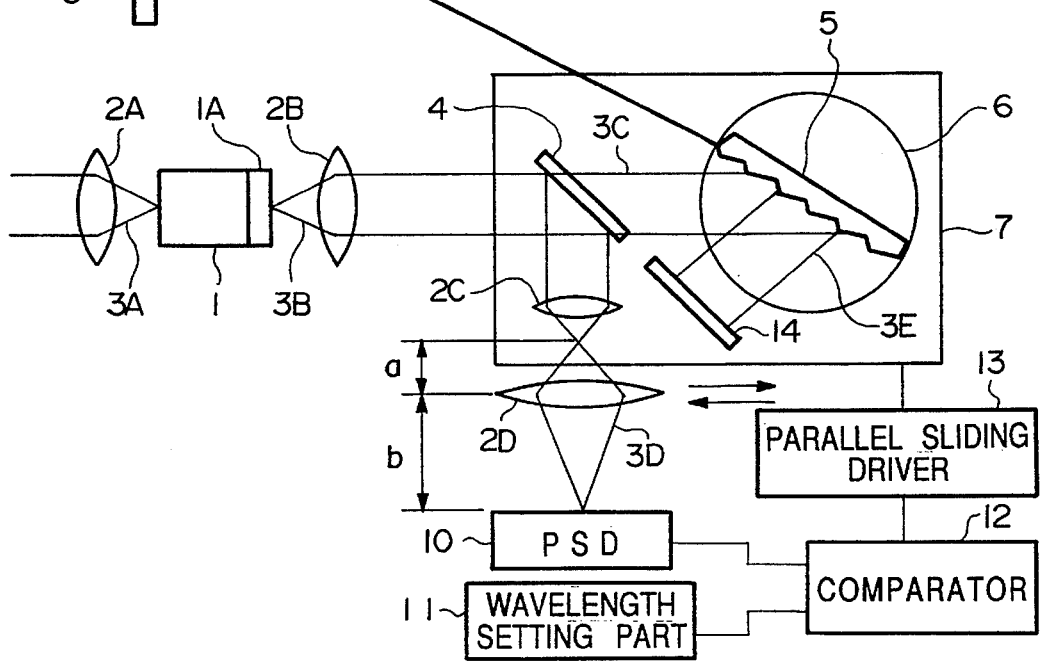
FIG. 2 is a block diagram showing the wavelength-variable semiconductor laser light source according to another embodiment of the present invention.

Next, FIG. 2 is a block diagram showing the wavelength-variable semiconductor laser light source according to another embodiment of the present invention.

In FIG. 2, reference numeral 14 indicates a total reflection mirror, and other parts in FIG. 2 are the same as those shown in FIG. 1.

In FIG. 2, semiconductor laser 1 outputs outgoing light 3B from the end face with antireflection film 1A. The output light 3B is transformed into collimated light by lens 2B and is split into transmitted light 3C and reflected light 3D by beam splitter 4. The transmitted light 3C from beam splitter 4 is input to the central part of diffraction grating 5 and diffracted light 3E is incident on total reflection mirror 14. At this time, an external resonator with length L is formed by the total reflection mirror 14 and the other end face without an antireflection film of semiconductor laser 1; thus, the semiconductor laser 1 oscillates at a single mode and emits outgoing light 3A from the other end face without an antireflection film.

In the arrangement shown in FIG. 2, the filtering characteristic of diffraction grating 5 is improved by inputting the diffracted light 3E from diffraction grating 5 to the diffraction grating 5 again. Other parts in the arrangement are the same as those shown in FIG. 1, that is, the oscillation wavelength of semiconductor laser 1 is set arbitrarily with high resolution under phase-continuous conditions by expanding reflected light 3D from beam splitter 4 via lens 2D and detecting the amount of parallel displacement of parallel sliding stage 7 with high resolution.

Figure 3:
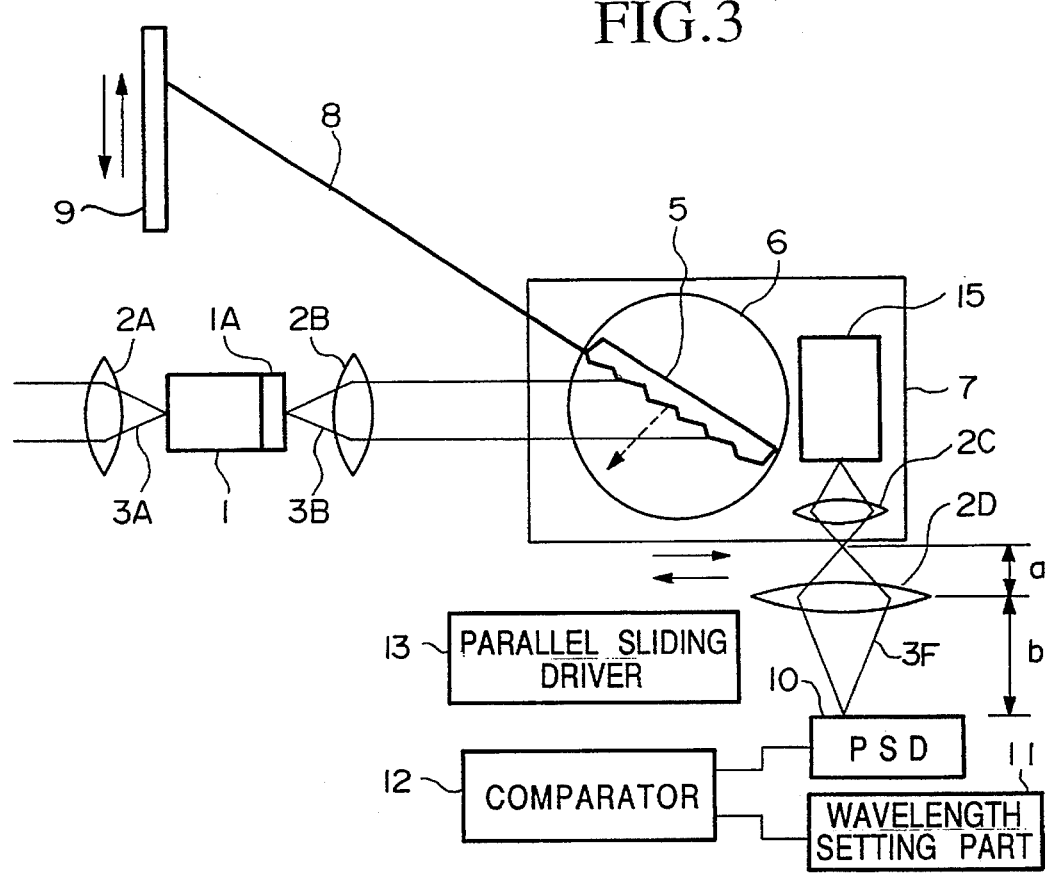
FIG. 3 is a block diagram showing the wavelength-variable semiconductor laser light source according to the third embodiment of the present invention.

Next, FIG. 3 is a block diagram showing the wavelength-variable semiconductor laser light source according to the third embodiment of the present invention.

In FIG. 3, reference numeral 15 indicates a light source and other parts in FIG. 3 are the same as those shown in FIG. 1. That is, FIG. 3 shows an arrangement in which special light source 15, light from which is incident on PSD 10, is provided. Outputted light 3F from the light source 15 is expanded by lens 2D and is incident on PSD 10, and the amount of the parallel movement of parallel sliding stage 7 is detected with high resolution, by which the oscillation wavelength of semiconductor laser 1 is set arbitrarily with high resolution under phase-continuous conditions. In addition, a semiconductor laser or an LED light source can be used as light source 15.

What is claimed is:

1. A wavelength-variable semiconductor laser light source comprising:

a semiconductor laser whose one end face is coated with an antireflection film;

a parallel sliding stage which moves in parallel with the optical axis of the semiconductor laser by a parallel sliding driver;

a beam splitter, fixed on the parallel sliding stage, for splitting outgoing light from the end face coated with the antireflection film into transmitted light and reflected light;

a diffraction grating fixed on a rotating stage which is provided on the parallel sliding stage, the diffraction grating for inputting the transmitted light from the beam splitter so as to form an external resonator with the other end face of the semiconductor laser;

a transformation mechanism for transforming the parallel motion of the parallel sliding stage into the rotational motion of the rotating stage;

a lens for expanding the reflected light from the beam splitter;

a PSD for inputting the expanded light from the lens and outputting an electric signal which is proportional to an amount of the displacement of the expanded light, the displacement being caused by the parallel movement of the parallel sliding stage;

a wavelength setting part for arbitrarily setting the oscillation wavelength of the semiconductor laser; and a comparator for comparing a set signal from the wavelength setting part with the electric signal from the PSD and feeding the result of the comparison back to the parallel sliding driver.

2. A wavelength-variable semiconductor laser light source in accordance with claim 1, further comprising:

a total reflection mirror for reflecting diffracted light from the diffraction grating so as to return the light to the semiconductor laser.

3. A wavelength-variable semiconductor laser light source comprising:

a semiconductor laser whose one end face is coated with an antireflection film;

a parallel sliding stage which moves in parallel with the optical axis of the semiconductor laser by a parallel sliding driver;

a diffraction grating fixed on a rotating stage which is provided on the parallel sliding stage, the diffraction grating for inputting an outgoing light from the end face coated with the antireflection film so as to form an external resonator with the other end face of the semiconductor laser;

a transformation mechanism for transforming the parallel motion of the parallel sliding stage into the rotational motion of the rotating stage;

a light source for outputting light, the light source being fixed on the parallel sliding stage in a manner such that the axis of the light shifts in accordance with the parallel movement of the parallel sliding stage;

a lens for expanding the light from the light source;

a PSD for inputting the expanded light from the lens and outputting an electric signal which is proportional to an amount of the displacement of the expanded light, the displacement being caused by the parallel movement of the parallel sliding stage;

a wavelength setting part for arbitrarily setting the oscillation wavelength of the semiconductor laser; and a comparator for comparing a set signal from the wavelength setting part with the electric signal from the PSD and feeding the result back to the parallel sliding driver.

\* \* \* \* \*